US012740022B2

(12) United States Patent
Zhu et al.

(10) Patent No.: US 12,740,022 B2
(45) Date of Patent: Sep. 15, 2026

(54) SERVER AND SERVER CABINET

(71) Applicants: SQ TECHNOLOGY(SHANGHAI) CORPORATION, Minhang (CN); INVENTEC CORPORATION, Taipei City (TW)

(72) Inventors: Kangguang Zhu, Shanghai (CN); Xiaogang Lu, Shanghai City (CN); Hong-Chou Lin, Taipei City (TW); Yu-Fan Chen, Taipei City (TW)

(73) Assignees: SQ TECHNOLOGY(SHANGHAI) CORPORATION, Shanghai (CN); INVENTEC CORPORATION, Taipei City (TW)

( * ) Notice: Subject to any disclaimer, the term of this patent is extended or adjusted under 35 U.S.C. 154(b) by 255 days.

(21) Appl. No.: 18/795,470

(22) Filed: Aug. 6, 2024

(65) Prior Publication Data

US 2026/0013082 A1 Jan. 8, 2026

(30) Foreign Application Priority Data

Jul. 2, 2024 (CN) ........................ 202410882196.5

(51) Int. Cl.
*H05K 7/20* (2006.01)

(52) U.S. Cl.
CPC ..... *H05K 7/20772* (2013.01); *H05K 7/20727* (2013.01)

(58) Field of Classification Search
CPC .......................... H05K 7/20772–20781; H05K 7/20809–20818
See application file for complete search history.

(56) References Cited

U.S. PATENT DOCUMENTS 7,595,458 B2 * 9/2009 Hattori .................. G06F 1/1656 200/341
11,729,946 B2 * 8/2023 Gao .................. H05K 7/20272 361/679.53

FOREIGN PATENT DOCUMENTS

CN 120547820 A * 8/2025 ........... H05K 7/1489

* cited by examiner

*Primary Examiner* — Robert J Hoffberg
(74) *Attorney, Agent, or Firm* — Maschoff Brennan

(57) ABSTRACT

A server includes a bottom casing, the bottom casing is provided with a first functional module, a power module and a fan module thereon, the server further includes a liquid cooling module directly contacting the first functional module, the power module and the fan module are located at a same side of the first functional module, a gap is located between the power module and the fan module, the bottom casing is provided with a drip hole corresponding to one end of the gap located farther away from the first functional module, two first partition structures are provided at a periphery of the power module and a periphery of the fan module, respectively, the first partition structures are configured to block liquid from entering into the power module and the fan module and guide the liquid to the drip hole when the liquid leaks from the liquid cooling module.

10 Claims, 8 Drawing Sheets

SERVER AND SERVER CABINET

CROSS-REFERENCE TO RELATED APPLICATIONS

This non-provisional application claims priority under 35 U.S.C. § 119(a) on Patent Application No(s). 202410882196.5 filed in China, on Jul. 2, 2024, the entire contents of which are hereby incorporated by reference.

BACKGROUND OF THE INVENTION

Technical Field of the Invention

The invention relates to a server technical field, more particularly to a server and a server cabinet.

Description of the Related Art

A server will generate a large amount of heat during operation, causing its temperature to rise, so the server requires the design of heat dissipation. Good heat dissipation is a key to ensure the efficient and stable operation of the server.

A conventional heat dissipation method for the server mainly rely on nature air convection or forced air convection provided by fans. However, in a server with high integration and high power density, this method is difficult to meet the heat dissipation requirements, and also bring problems such as noise and low energy efficiency. In order to solve these problems, liquid cooling technology has gradually become a new trend in server cooling. Liquid cooling technology takes away the heat generated inside the server through liquid circulation, which has the advantages of high heat dissipation efficiency, low noise, and high energy efficiency.

However, in the actual application of liquid cooling technology, if liquid leakage occurs, it will cause damage to the hardware inside the server, and may also cause safety risks in the data center, thereby restricting the application and the development of liquid cooling technology in the server field.

SUMMARY OF THE INVENTION

The invention provides a server and server cabinet, which adopts dual heat dissipation of liquid cooling and air cooling, and can prevent liquid leakage from causing damage to other modules while having simple structure and being easily achieved.

According to one aspect of the invention, a server is provided and includes a bottom casing, the bottom casing is provided with a first functional module, a power module and a fan module thereon, and the server further includes:

- a liquid cooling module directly in contact with the first functional module for cooling the first functional module.

The power module and the fan module are located at a same side of the first functional module, a gap is located between the power module and the fan module, and the bottom casing is provided with a drip hole corresponding to a position where one end of the gap located farther away from the first functional module is located.

Two first partition structures are provided at a periphery of the power module and a periphery of the fan module, respectively, and the two first partition structures are configured to block liquid from entering into the power module and the fan module and guide the liquid to the drip hole for discharging the liquid when the liquid leaks from the liquid cooling module.

Optionally, each of the two first partition structures includes a blocking wall and a guiding wall.

The blocking walls of the two first partition structures are in a L shape, a portion of the blocking wall of one of the two first partition structures is located between first functional module and the power module, a portion of the blocking wall of the other one of the two first partition structures is located between the first functional module and the fan module, and other portions of the blocking walls of the two first partition structures extend to the gap and are respectively connected to the guiding walls of the two first partition structures.

The guiding walls of the two first partition structures and the bottom casing together form a guiding channel extending to the drip hole.

Optionally, the bottom casing is provided with a second functional module, and the second functional module is located at another side of the first functional module.

A second partition structure is provided between the first functional module and the second functional module, and the second partition structure is configured to block the liquid from entering into the second functional module when the liquid leaks from the liquid cooling module.

Optionally, the second partition structure includes a blocking wall, and the blocking wall of the second partition structure is in a straight shape.

Optionally, the blocking wall comprises a wall body and a waterproof adhesive.

The waterproof adhesive is disposed on a surface of the wall body for protecting the wall body.

Optionally, a height of the wall body is not less than 5 mm.

Optionally, in each of the two first partition structures, a height of the guiding wall is smaller than a height of the blocking wall, and the guiding wall is made of a waterproof adhesive.

Optionally, an area of the bottom casing corresponding to the first functional module is assembled via a holeless riveting manner.

According to another aspect of the invention, a server cabinet is provided and includes a cabinet, a liquid receiving device and a plurality of aforementioned servers.

The servers are sequentially stacked and placed in the cabinet.

The liquid receiving device is located at a bottom of the cabinet and corresponds to the drip holes of the servers, and the liquid receiving device is configured to receive the liquid dripping from the drip hole of one of the servers.

Optionally, projections of the drip holes of the servers onto a horizontal plane are entirely overlapped; or Central points of projections of the drip holes of the servers onto the horizontal plane are entirely overlapped, and sizes of the drip holes of the servers gradually decreases along a direction away from the horizontal plane.

In the invention, the design of the structure of the server enables the server to include the bottom casing provided with the first functional module, the power module and the fan module and the liquid cooling module directly in contact with the first functional module. The cooperation of the fan module and the liquid cooling module can dissipate heat generated by the first functional module, thereby achieving dual heat dissipation of liquid cooling and air cooling. The power module and the fan module are located at a same side of the first functional module, the gap is located between the power module and the fan module, the bottom casing is provided with the drip hole corresponding to the position where one end of the gap located farther away from the first functional module is located, the two first partition structures are provided at the periphery of the power module and the periphery of the fan module, respectively, the first partition structures are configured to block liquid from entering into the power module and the fan module and guide the liquid to the drip hole for discharging the liquid when the liquid leaks from the liquid cooling module. As a result, the leaking liquid is prevented from damaging other modules. On the other hand, this product has a simple structure and is easily to be achieved, and the first partition structures provided at the periphery of the power module and the periphery of the fan module have less influence to the mold of the product. Even if the existing mold is used, the first partition structures are merely required to be additionally installed on the existing mold, thereby having a stronger application.

It should be understood that the content described in this section neither intend to indicate key or important features of the embodiments of the invention nor limit the scope of the invention. Other features of the invention will become easily understood from the following descriptions.

BRIEF DESCRIPTION OF THE DRA WINGS

In order to more clearly illustrate the technical solutions in the embodiments of the invention, the drawings used in the descriptions of the embodiments will be briefly introduced below. Obviously, the drawings in the following descriptions are only a part of the invention. For those skilled in this field, other drawings can be obtained based on these present drawings without exerting creative efforts.

DETAILED DESCRIPTION

In order to enable those skilled in the technical field to clearly understand the solutions of the invention, the technical solutions in the embodiments of the invention will be clearly and completely described below in conjunction with the drawings in the embodiments of the invention. Obviously, the described embodiments are only some of the embodiments of the invention, but not all of the embodiments. Based on the embodiments of the invention, other embodiments obtained by those skilled in the art without making creative efforts should fall within the scope of the invention.

Note that the terms "first", "second", etc. in the specification, claims and the above-mentioned drawings of the invention are used to distinguish similar objects, and are not necessarily used to describe a specific sequence or order. It should be understood that the such terms can be interchangeable under appropriate circumstances so that the embodiments of the invention described herein are capable of being practiced in sequences other than those illustrated or described herein. In addition, the terms "including" and "having" and any variations thereof are intended to cover non-exclusive inclusions. For example, a process, method, system, product, or apparatus that includes a sequence of steps or elements is not limited to those steps or elements that are expressly listed, but may include steps or elements that are not expressly listed or that are inherent to the process, method, product, or apparatus.

First Embodiment

Figure 1:
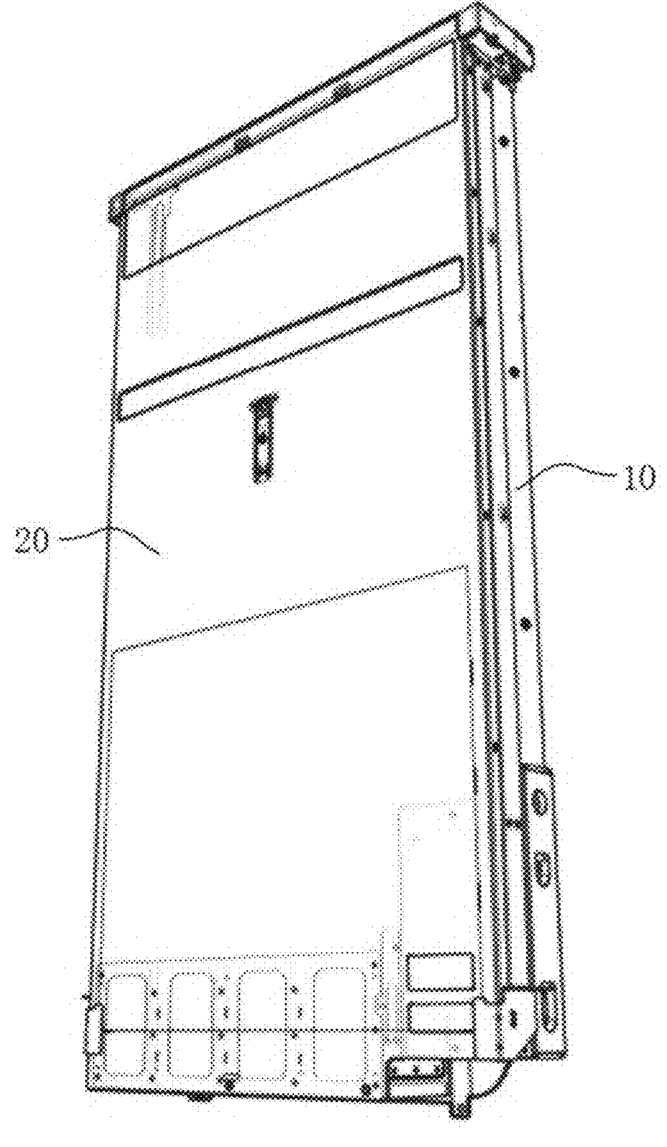
FIG. 1 is a perspective view of a server according to a first embodiment of the invention.

FIG. 1 is a perspective view of a server according to a first embodiment of the invention. As shown in FIG. 1, the server includes a bottom casing 10 and a top casing 20. The bottom casing 10 and the top casing 20 are assembled with each other so as to form an accommodation space. The accommodation space is provided with various modules therein. The bottom casing 10 and the top casing 20 are configured to protect the various modules in the accommodation space.

Figure 2:
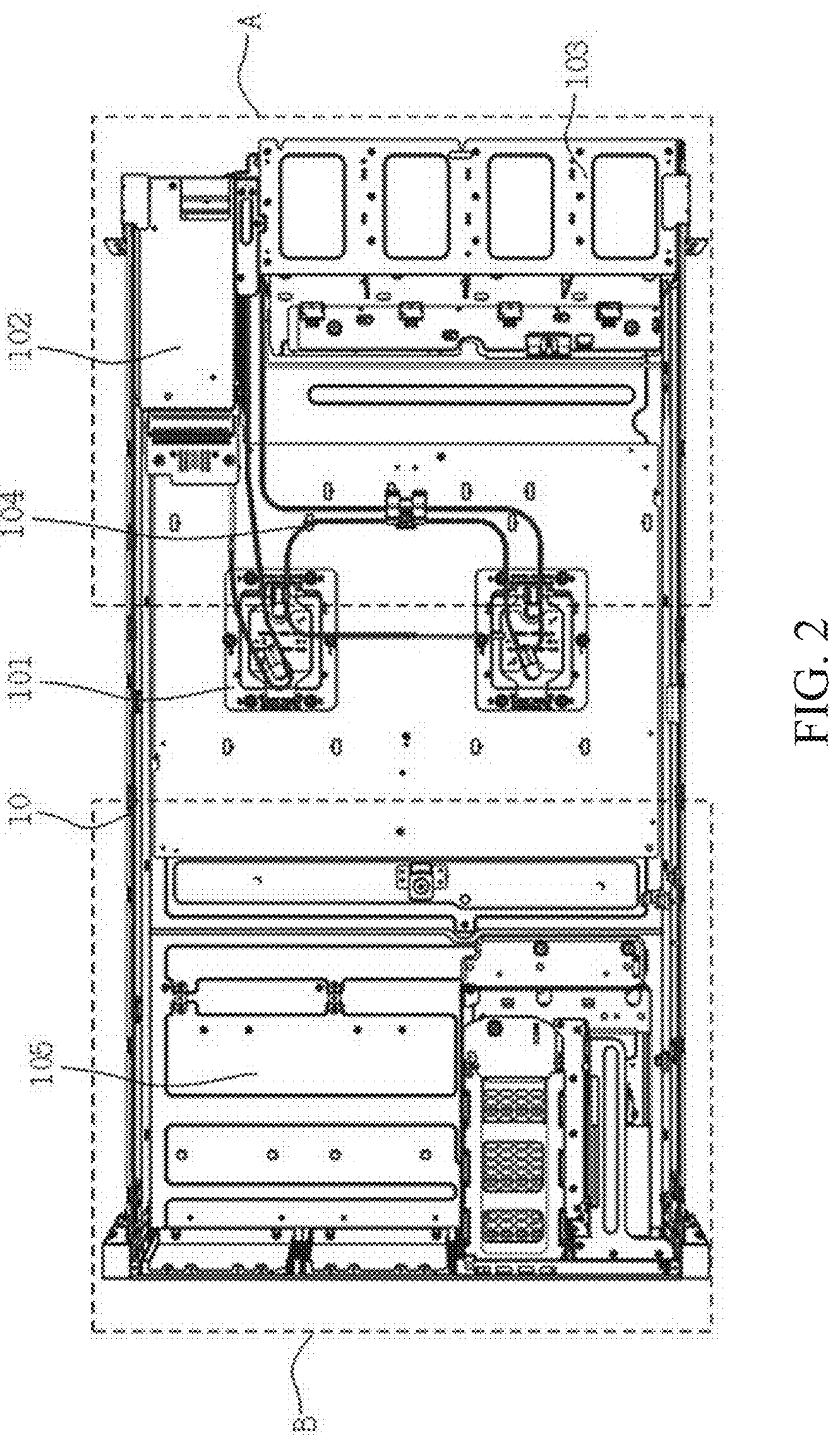
FIG. 2 is a top view of the server according to the first embodiment of the invention when a top casing is removed.

FIG. 2 is a top view of the server according to the first embodiment of the invention when a top casing is removed. As shown in FIG. 2, the bottom casing 10 is provided with a first functional module 101, a power module 102 and a fan module 103 thereon. The first functional module 101 can be considered as a module that required to be cooled, such as a CPU, a GPU or various chips. The power module 102 is configured to provide electricity to other modules of the server. The fan module 103 can dissipate heat generated by the first functional module 101 via fans.

The server further includes a liquid cooling module 104 directly in contact with the first functional module 101. The liquid cooling module 104 is configured to cool the first functional module 101 and dissipate heat generated by the first functional module 101. Specifically, the liquid cooling module 104 may include a cold plate, an inlet pipe and an outlet pipe, and the cold plate communicate with the inlet pipe and the outlet pipe. A cold liquid enters into the cold plate through the inlet pipe, and the cold plate performs heat exchange with the first functional module 101 which directly contacts the cold plate, such that the liquid in the cold plate is heated. Then, the hot liquid flow out of the cold plate through the outlet pipe.

However, the liquid may leak from the position where the inlet pipe and the outlet pipe are connected to the cold plate. In order to prevent the leaking liquid from damaging other modules, the bottom casing 10 is provided with two first partition structures 301.

Figure 3:
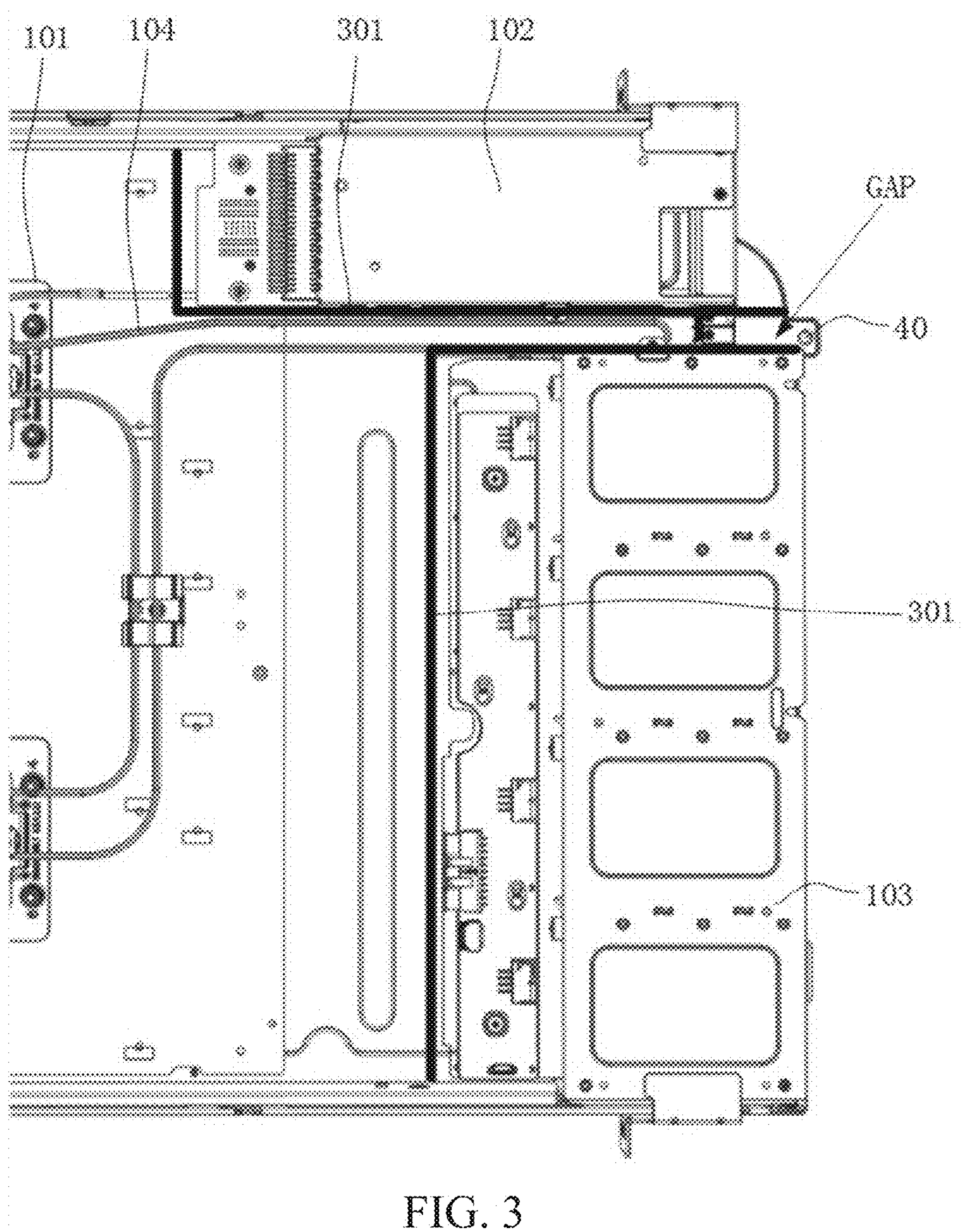
FIG. 3 is a partial enlarged view of an area A of the server in FIG. 2.

In order to clearly show the structure of the server, FIG. 3 is a partial enlarged view of an area A of the server in FIG. 2. As shown in FIG. 3, the power module 102 and the fan module 103 are located at a same side of the first functional module 101. For example, in FIG. 3, the power module 102 and the fan module 103 are located at the right side of the first functional module 101. A gap GAP is located between the power module 102 and the fan module 103 (e.g., shown by an arrow in FIG. 3). The bottom casing 10 is provided with a drip hole 40 corresponding a position where one end of the gap GAP located farther away from the first functional module 101 is located. The drip hole 40 is generally in a round shape or a rectangular shape.

The first partition structures 301 are disposed at a periphery of the power module 102 and a periphery of the fan module 103, respectively. The first partition structures 301 are configured to block the liquid from entering into the power module 102 and the fan module 103 and guide the liquid to the drip hole 40 for discharging the liquid when the liquid leaks from the liquid cooling module 104.

In one embodiment, the inlet pipe and the outlet pipe of the liquid cooling module 104 can be arranged in the gap GAP for effectively utilizing the accommodation space of the server.

Figure 4:
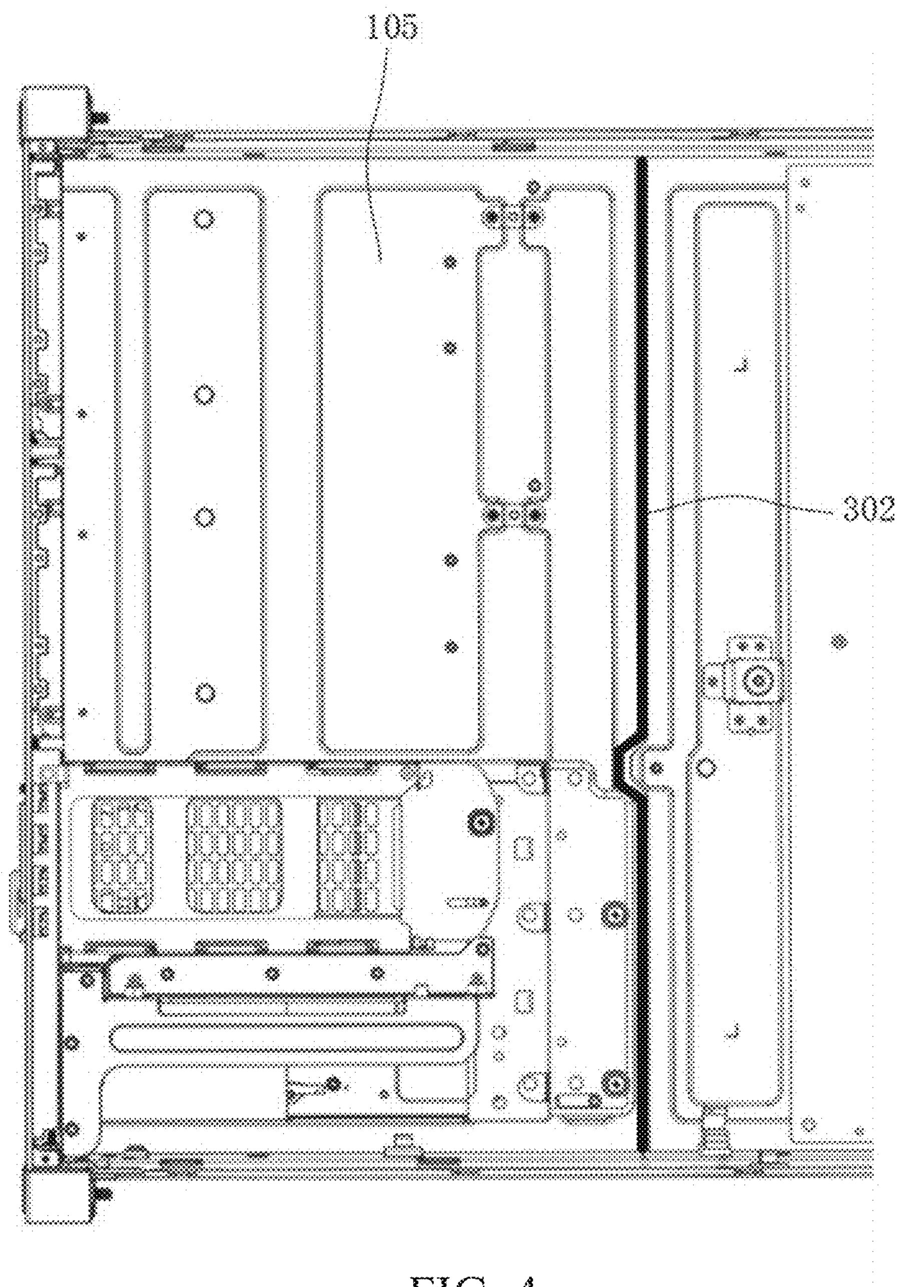
FIG. 4 is a partial enlarged view of an area B of the server in FIG. 2.

Optionally, FIG. 4 is a partial enlarged view of an area B of the server in FIG. 2. As shown in FIGS. 2 and 4, the bottom casing 10 is further provided with a second functional module 105 thereon. The second functional module 105 can be considered as a module that does not require heat dissipation or is unsuitable for liquid cooling heat dissipation. The second functional module 105 is located at another side of the first functional module 101. In FIG. 4, the second functional module 105 is located at the left side of the first functional module 101. Optionally, the quantity of the second functional module 105 is at least one.

A second partition structure 302 is provided between the first functional module 101 and the second functional module 105. The second partition structure 302 is configured to block the liquid from entering into the second functional module 105 when the liquid leaks from the liquid cooling module 104.

Figure 5:
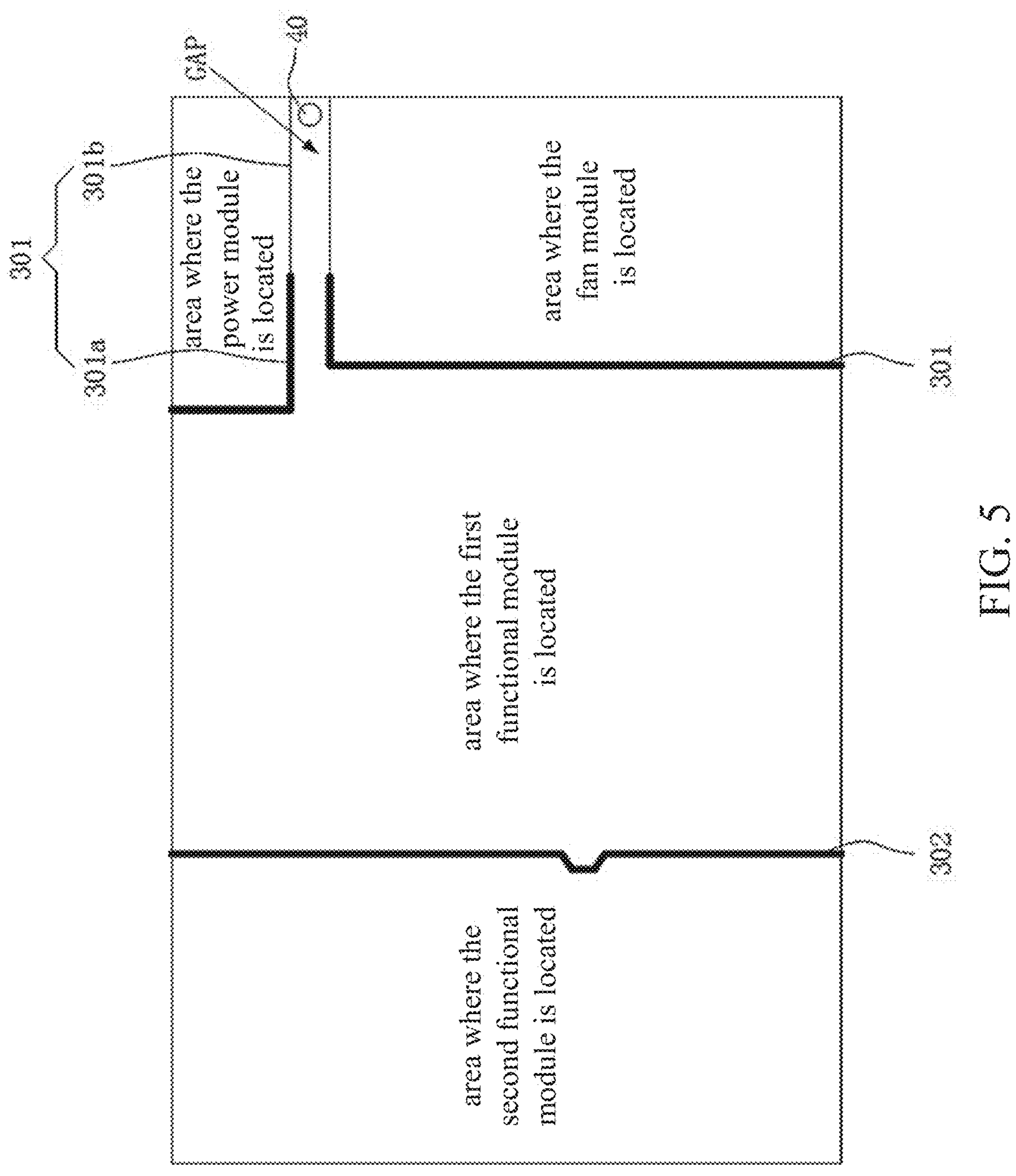
FIG. 5 is a top view of partition structures according to the first embodiment of the invention.

In one embodiment, FIG. 5 is a top view of partition structures according to the first embodiment of the invention. As shown in FIG. 5, each of the first partition structures 301 includes a blocking wall 301*a* and a guiding wall 301*b*. The blocking wall 301*a* of each of the first partition structures 301 is in a L shape. A portion of the L-shaped blocking wall 301*a* of one of the first partition structures 301 is located between first functional module 101 and the power module 102, a portion of the L-shaped blocking wall 301*a* of the other one of the first partition structures 301 is located between the first functional module 101 and the fan module 103, and other portions of the L-shaped blocking walls of the first partition structures extend to the gap GAP and are respectively connected to the guiding walls 301*b* of the first partition structures 301. The guiding walls 301*b* and the bottom casing 10 together form a guide channel extending to the drip hole 40.

The second partition structure 302 includes a blocking wall, and the blocking wall of the second partition structure 302 is in a straight shape.

Optionally, heights of the guiding walls 301*b* are smaller than heights of the L-shaped blocking walls 301*a*. The guiding walls 301*b* are made of waterproof adhesives. Therefore, the material can be saved, and the occupation to the gap GAP can be reduced while the guiding walls 301*b* and the bottom casing 10 are ensured to together form the guiding channel extending to the drip hole 40.

Figure 6:
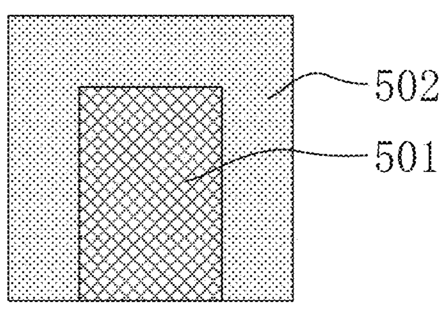
FIG. 6 is a cross-sectional view of a blocking wall according to the first embodiment of the invention.

In one embodiment, FIG. 6 is a cross-sectional view of a blocking wall according to the first embodiment of the invention. As shown in FIG. 6, the blocking wall includes a wall body 501 and a waterproof adhesive 502. The waterproof adhesive 502 is disposed on a surface of the wall body 501 for protecting the wall body 501. The waterproof adhesive 502 has various advantages, such as high flexibility, waterproof characteristics, moisture insulation, strong adhesion and breach resistance, for effectively protecting the wall body 501.

Optionally, a height of the wall body 501 is not less than 5 mm for improving the reliability of the blocking wall.

In one embodiment, the material of the wall body 501 is not limited in the invention. The wall body 501 may be made of metal material or metal alloy material, or may be made of acrylic material or elastic material. When the wall body 501 is made of metal material or metal alloy material, the wall body 501 and the bottom casing 10 may be integrally formed as a single piece for increasing sealing property between the wall body 501 and the bottom casing 10. When the wall body 501 is made of acrylic material or elastic material, the wall body 501 may be adhered on the bottom casing 10. As a result, the mold for manufacturing the bottom casing 10 is not required to be modified, thereby facilitating the modification of the existing bottom casing 10.

Figure 7:
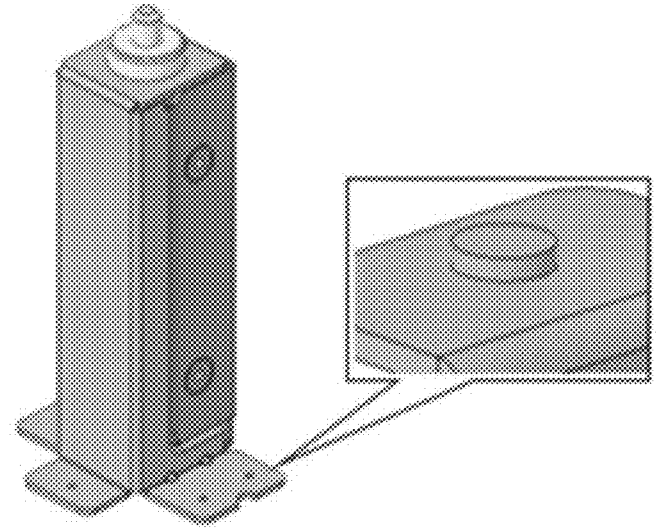
FIG. 7 is a schematic view of holeless riveting according to the first embodiment of the invention.

Furthermore, in order to prevent the leaking liquid from damaging other servers, an area of the bottom casing 10 corresponding to the first functional module 101 is assembled via a holeless riveting manner. FIG. 7 is a schematic view of holeless riveting according to the first embodiment of the invention. As shown in FIG. 7, an area of the bottom casing 10 corresponding to the first functional module 101 is assembled via a holeless riveting manner, thereby preventing the liquid from dripping from the bottom casing 10 when the liquid leaks from the liquid cooling module 104.

The embodiment of the invention provide a server, the server includes a bottom casing, the bottom casing is provided with a first functional module, a power module and a fan module thereon, the server further includes a liquid cooling module directly in contact with the first functional module for cooling the first functional module, the power module and the fan module are located at a same side of the first functional module, a gap is located between the power module and the fan module, the bottom casing is provided with a drip hole corresponding to a position where one end of the gap located farther away from the first functional module is located, two first partition structures are provided at a periphery of the power module and a periphery of the fan module, respectively, the first partition structures are configured to block liquid from entering into the power module and the fan module and guide the liquid to the drip hole for discharging the liquid when the liquid leaks from the liquid cooling module. In the invention, the design of the structure of the server enables the server to include the bottom casing provided with the first functional module, the power module and the fan module and the liquid cooling module directly in contact with the first functional module. The cooperation of the fan module and the liquid cooling module can dissipate heat generated by the first functional module, thereby achieving dual heat dissipation of liquid cooling and air cooling. The power module and the fan module are located at a same side of the first functional module, the gap is located between the power module and the fan module, the bottom casing is provided with the drip hole corresponding to the position where one end of the gap located farther away from the first functional module is located, the two first partition structures are provided at the periphery of the power module and the periphery of the fan module, respectively, the first partition structures are configured to block liquid from entering into the power module and the fan module and guide the liquid to the drip hole for discharging the liquid when the liquid leaks from the liquid cooling module. As a result, the leaking liquid is prevented from damaging other modules. On the other hand, this product has a simple structure and is easily to be achieved, and the first partition structures provided at the periphery of the power module and the periphery of the fan module have less influence to the mold of the product. Even if the existing mold is used, the first partition structures are merely required to be additionally installed on the existing mold, thereby having a stronger application.

Second Embodiment

Figure 8:
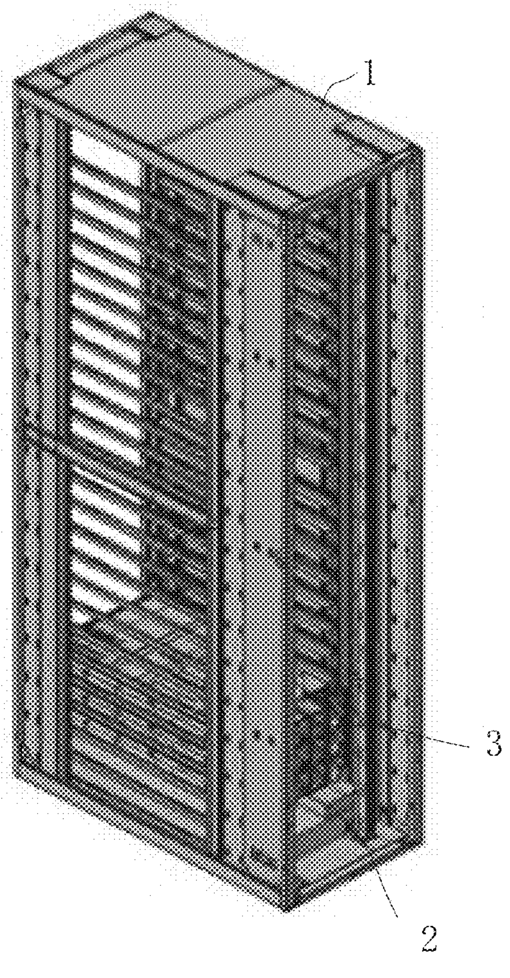
FIG. 8 is a perspective view of a server cabinet according to a second embodiment of the invention.
Figure 9:
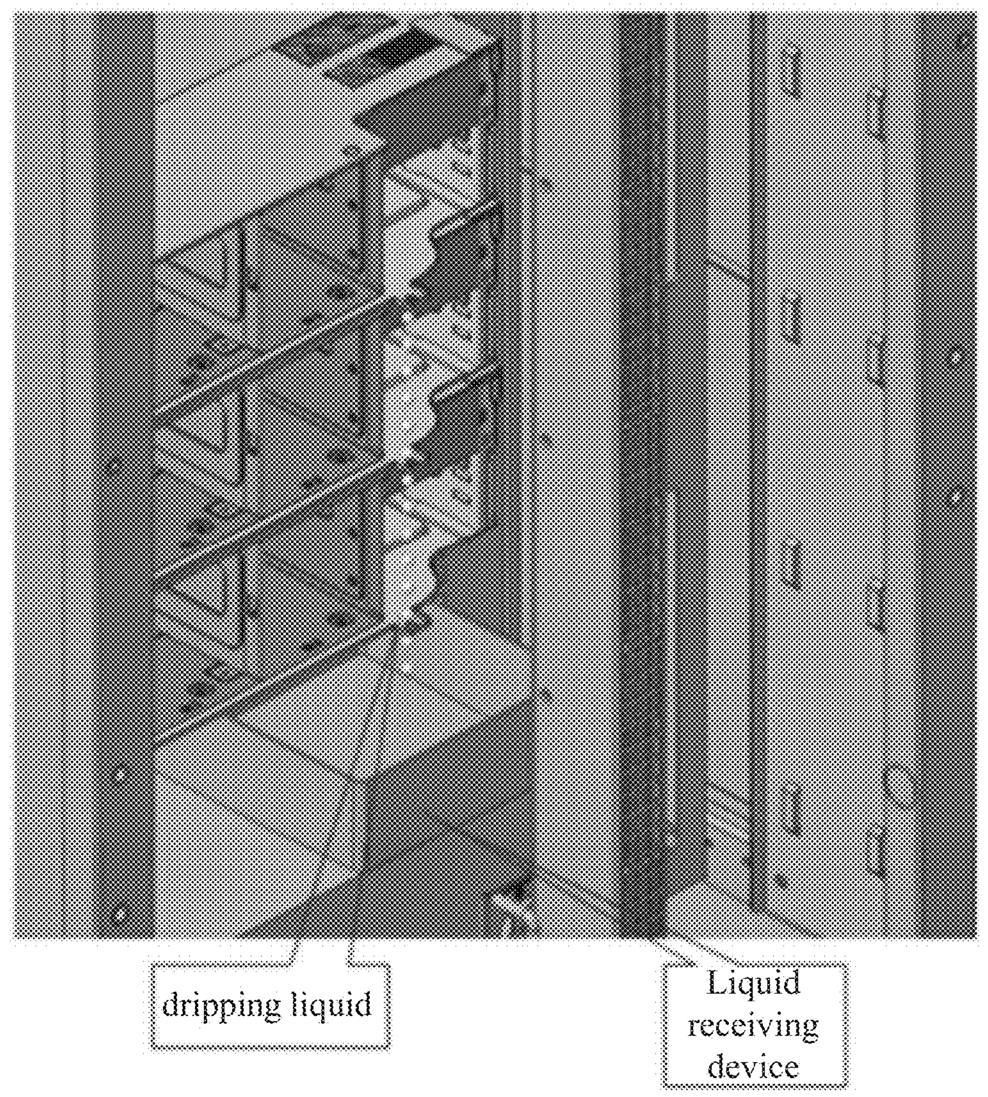
FIG. 9 is a schematic view of the server cabinet according to the second embodiment of the invention showing liquid collection.

FIG. 8 is a perspective view of a server cabinet according to a second embodiment of the invention, and FIG. 9 is a schematic view of the server cabinet according to the second embodiment of the invention showing liquid collection.

As shown in FIGS. 8 and 9, the server cabinet includes a cabinet 1, a liquid receiving device 2 and a plurality of servers 3 of the previous embodiment. The servers 3 are sequentially stacked and placed in the cabinet 1. The liquid receiving device 2 is located at a bottom of the cabinet 1 and corresponds to the drip holes of the servers 3. The liquid receiving device 2 is configured to receive the liquid dripping from the drip hole of one of the servers 3.

In order to enable the liquid to smoothly drip, in one applicable manner, projections of the drip holes of the servers 3 onto a horizontal plane are entirely overlapped.

In another applicable manner, central points of projections of the drip holes of the servers 3 onto the horizontal plane are entirely overlapped, and sizes of the drip holes of the servers 3 gradually decreases along a direction away from the horizontal plane, which prevents the liquid from dripping and splashing onto the below bottom casing.

The above specific embodiments do not constitute limitations to the scope of the invention. It will be understood by those skilled in the art that various modifications, combinations, sub-combinations and substitutions are possible depending on design requirements and other factors. Any modifications, equivalent substitutions and improvements made within the spirit and principles of the invention shall be included in the scope of the invention.

What is claimed is:

1. A server, comprising a bottom casing, wherein the bottom casing is provided with a first functional module, a power module and a fan module thereon, and the server further comprises:

a liquid cooling module, directly in contact with the first functional module for cooling the first functional module;

wherein the power module and the fan module are located at a same side of the first functional module, a gap is located between the power module and the fan module, and the bottom casing is provided with a drip hole corresponding to a position where one end of the gap located farther away from the first functional module is located;

wherein two first partition structures are provided at a periphery of the power module and a periphery of the fan module, respectively, the two first partition structures are configured to block liquid from entering into the power module and the fan module and guide the liquid to the drip hole for discharging the liquid when the liquid leaks from the liquid cooling module.

2. The server according to claim 1, wherein each of the two first partition structures comprises a blocking wall and a guiding wall;

wherein the blocking wall of each of the two first partition structures are in a L shape, a portion of the blocking wall of one of the two first partition structures is located between first functional module and the power module, a portion of the blocking wall of another one of the two first partition structures is located between the first functional module and the fan module, and other portions of the blocking walls of the two first partition structures extend to the gap and are respectively connected to the guiding walls of the two first partition structures; and wherein the guiding walls of the two first partition structures and the bottom casing together form a guiding channel extending to the drip hole.

3. The server according to claim 2, wherein in each of the two first partition structures, a height of the guiding wall is smaller than a height of the blocking wall, and the guiding wall is made of a waterproof adhesive.

4. The server according to claim 1, wherein the bottom casing is provided with a second functional module, the second functional module is located at another side of the first functional module; and wherein a second partition structure is provided between the first functional module and the second functional module, and the second partition structure is configured to block the liquid from entering into the second functional module when the liquid leaks from the liquid cooling module.

5. The server according to claim 4, wherein the second partition structure comprises a blocking wall, and the blocking wall of the second partition structure is in a straight shape.

6. The server according to claim 5, wherein the blocking wall comprises a wall body and a waterproof adhesive; and wherein the waterproof adhesive is disposed on a surface of the wall body for protecting the wall body.

7. The server according to claim 6, wherein a height of the wall body is not less than 5 mm.

8. The server according to claim 1, wherein an area of the bottom casing corresponding to the first functional module is assembled via a holeless riveting manner.

9. A server cabinet, comprising a cabinet, a liquid receiving device and a plurality of servers according to claim 1;

wherein the plurality of servers are sequentially stacked and placed in the cabinet; and wherein the liquid receiving device is located at a bottom of the cabinet and corresponds to the drip holes of the plurality of servers, and the liquid receiving device is configured to receive the liquid dripping from the drip hole of at least one of the plurality of servers.

10. The server cabinet according to claim 9, wherein projections of the drip holes of the plurality of servers onto a horizontal plane are entirely overlapped; or central points of the projections of the drip holes of the plurality of servers onto the horizontal plane are entirely overlapped, and sizes of the drip holes of the plurality of servers gradually decreases along a direction away from the horizontal plane.

* * * * *